United States Patent [19]

Gaudenzi et al.

[11] Patent Number: 5,313,366
[45] Date of Patent: May 17, 1994

[54] DIRECT CHIP ATTACH MODULE (DCAM)

[75] Inventors: Gene J. Gaudenzi, Purdy's; Perwaiz Nihal, Hopewell Junction, both of N.Y.

[73] Assignee: International Business Machines Corporation, Armonk, N.Y.

[21] Appl. No.: 929,631

[22] Filed: Aug. 12, 1992

[51] Int. Cl.$^5$ .............................................. H05K 7/02
[52] U.S. Cl. ................... 361/760; 361/762; 361/767; 361/795; 174/52.4; 174/262; 174/52.2; 257/686; 257/779
[58] Field of Search ............... 361/394, 396, 397, 400, 361/401, 403, 414, 415, 421, 744, 748, 760, 761, 762, 767, 792, 795, 796, 813; 174/52.2, 52.4, 260, 262; 257/666, 686, 787, 779

[56] References Cited

U.S. PATENT DOCUMENTS

| | | | |
|---|---|---|---|
| 4,034,468 | 7/1977 | Koopman et al. | 29/628 |
| 4,074,342 | 2/1978 | Honn et al. | 361/411 |
| 4,193,082 | 3/1980 | Dougherty et al. | 357/80 |
| 4,202,007 | 5/1980 | Dougherty et al. | 357/80 |
| 4,415,025 | 11/1983 | Horvath | 165/185 |
| 4,682,270 | 7/1987 | Whitehead et al. | 361/401 |
| 4,803,595 | 2/1989 | Kraus et al. | 361/412 |
| 4,821,142 | 4/1989 | Ushifusa et al. | 361/395 |
| 4,827,328 | 5/1989 | Ozawa et al. | 357/80 |
| 5,048,178 | 9/1991 | Bindra et al. | 29/830 |
| 5,110,664 | 5/1992 | Nakanishi et al. | 428/195 |
| 5,220,489 | 6/1993 | Barreto et al. | 361/400 |

FOREIGN PATENT DOCUMENTS 61-10263  1/1986  Japan .................................. 357/71

OTHER PUBLICATIONS

J. Benenati, et al., "Circuit Package" IBM Technical Disclosure Bulletin, vol. 10, No. 12, pp. 1977–1978 (May 1968).
P. Geldermans, "Flexible Solder Connection and Method of Fabricating" IBM Technical Disclosure Bulletin, vol. 18, No. 5, pp. 1379–1380 (Oct. 1975).
M. T. McMahon, Jr., "Semiconductor Device Carrier for Modules" IBM Technical disclosure Bulletin, vol. 18, No. 5, pp. 1440–1441 (Oct. 1975).
E. Berndlmaier, et al., "High Performance Package" IBM Technical Disclosure Bulletin, vol. 20, No. 8, p. 3090 (Jan. 1978).
J. A. Curtis, et al., "High-Performance Multi-Chip Carrier" IBM Technical Disclosure Bulletin, vol. 33, No. 2, pp. 15–16 (Jul. 1990).
Disclosed Anonymously, "Organic Card Device Carrier" Research Disclosure, Kenneth Mason Publications, Ltd., May 1990, No. 313.
S. B. Greenspan, "C-4 Package for Programmable Read-Only Memory" IBM Technical Disclosure Bulletin, vol. 23, No. 3, pp. 879–880 (Aug. 1980).
F. Motika, "Flip-Chip on Personalization Chip Carrier Package" IBM Technical Disclosure Bulletin, vol. 23, No. 7A, Dec. 1980 pp. 2770–2773.
R. S. Austenfeld, et al. "High Density Direct Chip Attach Substrate Manufacturing Process" IBM Technical Disclosure Bulletin, vol. 34, No. 2, Jul. 1991, pp. 85–86.

Primary Examiner—Leo P. Picard
Assistant Examiner—Young Whang
Attorney, Agent, or Firm—Peterson, Jr. Charles W.

[57] ABSTRACT

A low cost Surface Mount Carrier (SMC) for carrying integrated circuit chips mounted thereon. The carrier, or interposer, is a thin-small single layer or, a multilayer deck of printed circuit board (FR-4) material with at least one direct chip attach (DCA) site for mounting a semiconductor chip. The DCA site has chip bonding pads wherein the integrated circuit chip's pads are wire bonded to or soldered to the carrier. The bonding pads are connected to wiring pads through interlevel vias and wiring lands or traces which may be on one of several wiring planes. The carrier is connected to the next level of packaging through the wiring pads.

15 Claims, 4 Drawing Sheets

DIRECT CHIP ATTACH MODULE (DCAM)

FIELD OF THE INVENTION

The present invention relates to Integrated Circuit Chip Packaging and in particular to low cost multi-chip packaging.

BACKGROUND OF THE INVENTION

Integrated Circuit (IC) modules containing integrated chips mounted on a circuit transposer, also called a carrier, a deck or an interposer, are known in the art. For example, see U.S. Pat. No. 4,074,342, assigned to the assignee of the present invention and incorporated herein by reference. As disclosed in U.S. Pat. No. 4,074,342 and shown in FIG. 1 herein, the chip interposer 30 was externally connected through solder balls 32 on one interposer surface to a substrate 29. Deposited conductors 34 interconnect mounted integrated circuit chips 36 with each other and with the external solder balls 32 through vias 38. The integrated circuit chips are also attached to the interposer by solder balls 42. Module pins 24, which are connected through substrate wiring (not shown) to the interposer, connect the module to the next level of packaging, i.e. to the printed circuit board. These interposers may carry more than one chip and provide interconnections both between the chips mounted thereon and to external package pins. Because of the complexity added to the IC module by including the interposer, these modules are expensive. The interposer may be as complex as the module substrate. Consequently, the interposer may cost as much as the substrate and may, therefore, double the module cost.

Besides the added cost of the interposer, the module cost is higher because the addition of the interposer reduces module yield. Since, the interposer, which, typically, is soldered to the substrate, adds module assembly steps, these modules have more opportunities to fail. Assembly failures may occur from a defective part, e.g., the interposer, chip or substrate, or, from faulty solder connections.

Furthermore, good solder connections may fail under normal operating conditions because of non-uniform package thermal expansion or contraction. Normally, the chips themselves are the source of the heat that causes thermal expansion. Since each chip may burn several watts of power, encapsulating several chips mounted on a single interposer quickly leads to a significant amount of heat in the final package. Additionally, since, in some more complex packages, heat is removed directly form the chips, the substrate is cooled through the chips. Thus, when such a package is turned off, the chips cool faster than the substrate, placing additional mechanical stress on the package. Thermal expansion or contraction places mechanical stress on everything in the package. Consequently, the chip or carrier bonds may receive catastrophic stress. In order to maintain chip temperature to within a desired temperature range, the heat generated by the chips in the package must be transferred from the chips to the exterior of the package, and then, dissipated. The more efficient the heat transfer, the narrower the package operating temperature range. The narrower the package operating temperature range, the less the thermal expansion or contraction that occurs.

Non-uniform package temperature further exacerbates stress. One approach to reducing non-uniform temperature related stress in these modules was to make the interposer of a material having the same Temperature Coefficient of Expansion (TCE) as the chips. However, this meant that the interposer was made of the same material and in the same manner as the IC chips. As noted above, making the interposer in the same manner as the substrate kept package cost high.

Heat transfer and power dissipation is important, not only for reliability reasons, but also for newer semiconductor technologies and for superconductors which must operate at liquid nitrogen temperatures or below. These low temperature IC's require fast efficient heat transfer and dissipation. If the junction temperature of a low temperature IC rises too far above the boiling point of liquid nitrogen, the IC will fail. Consequently, very expensive, complicated packages have been required for low temperature applications. These low temperature chip packages are a major portion of the cost of low temperature IC's.

OBJECTS OF THE INVENTION

It is an object of the invention to reduce multiple integrated circuit chip package costs.

It is another object of this invention to improve multiple integrated circuit chip package reliability.

It is still another object of this invention to improve heat transfer in multiple integrated circuit chips.

It is still another object of this invention to reduce chip package costs, improve reliability and to improve heat transfer capacity in integrated circuit chip packages.

SUMMARY OF THE INVENTION

The present invention is a low cost Integrated Circuit (IC) chip carrier and Package, or Module, for packaging one or more integrated circuits. The package includes the carrier upon which the IC chips are mounted. The carrier has: one or more chip mounting locations on a top surface; one or more wiring planes or layers, which may be located on the top surface, on a bottom surface and layered between the top and bottom surfaces; and, bonding pads which provide signal and power connections between the carrier and the next level of packaging. The carrier is made of the same resin fiberglass composite material from which printed circuit cards are made. The interposer may be further mounted in a standard package such as a Dual In-line Pin (DIP) Package or a Plastic Leaded Chip Carrier (PLCC). Connection between carrier bonding pads and the standard package is by wire bonding. Alternatively, the carrier may be mounted and connected by solder or solder-paste between the carrier bonding pads and the substrate. In an alternative embodiment, the carrier, with chips mounted in the chip mounting locations, is directly attached to, or mounted on a printed circuit card.

BRIEF DESCRIPTION OF THE DRAWINGS

While the specification concludes with claims particularly pointing out and distinctly claiming that which is regarded as the present invention, details of the preferred embodiments of the present invention may be more readily ascertained from the following technical description when read in conjunction with the following drawings wherein:

TECHNICAL DESCRIPTION OF THE PREFERRED EMBODIMENTS

Figure 1:
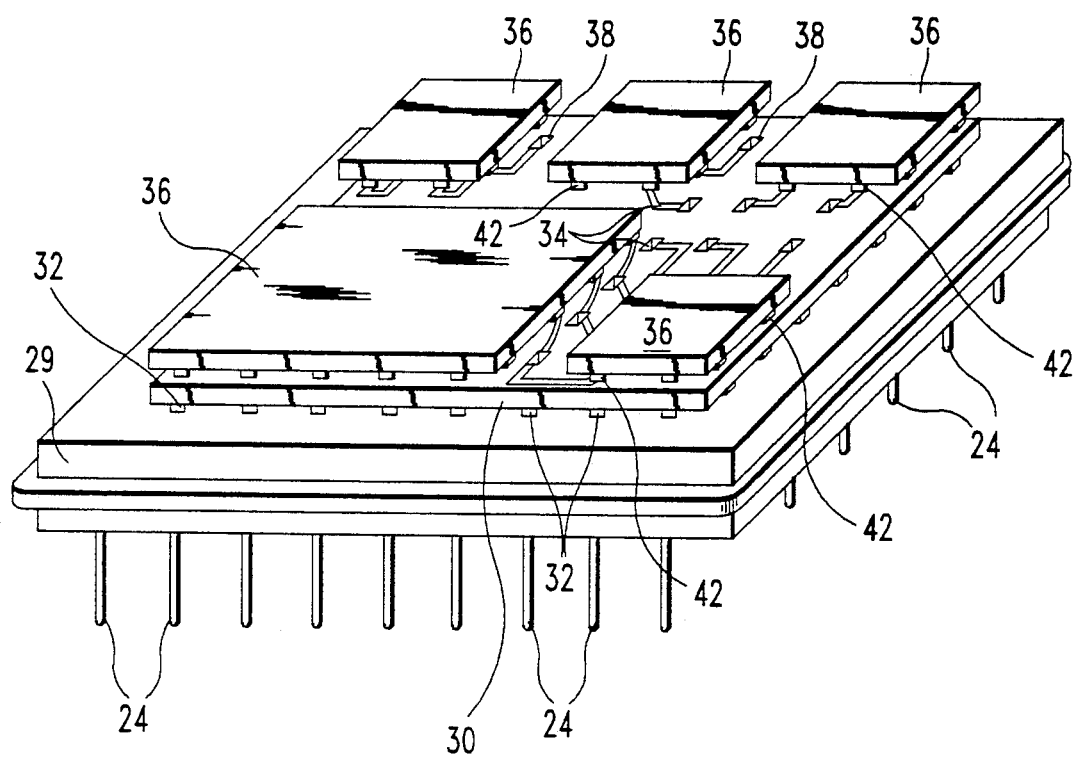
FIG. 1 is a prospective view of a prior art Multi-chip Package.
Figure 2A:
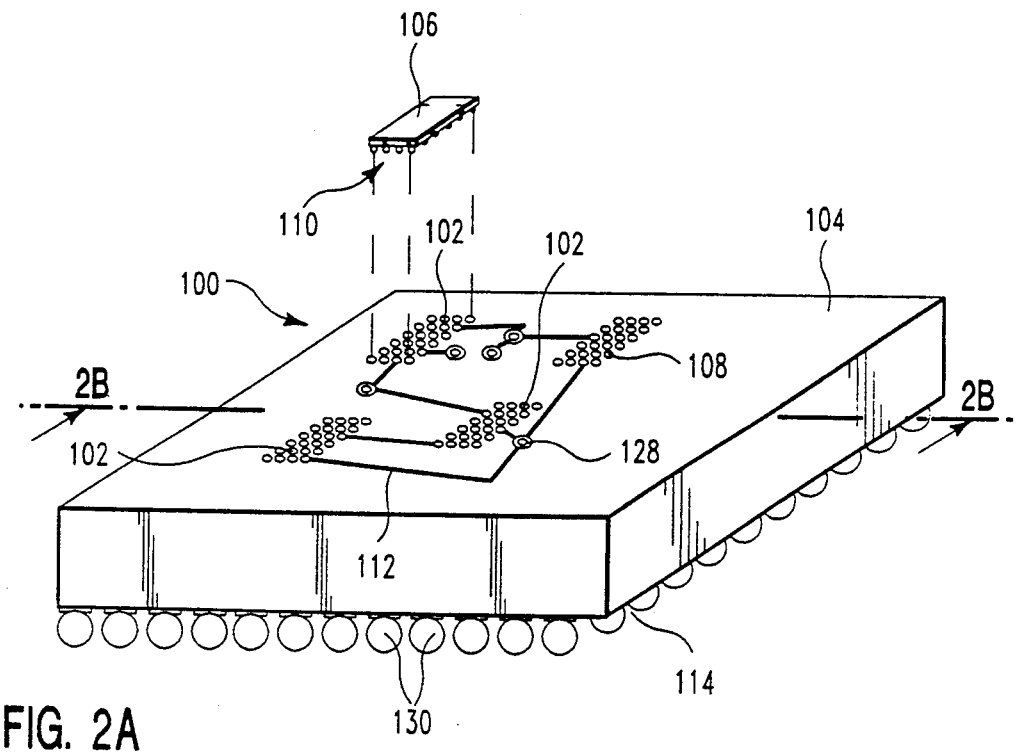
FIG. 2A is a prospective view a preferred embodiment of the present invention.

FIG. 2A is a prospective view of an example of the chip carrier of the preferred embodiment of the present invention. The chip carrier 100 has one or more chip locations 102 on a top surface 104 for mounting Integrated Circuit (IC) chips 106. Although the carrier 100 in the example on FIG. 2A shows four chip mounting locations 102, the number of mounting locations 102 shown is exemplary and not intended to be limiting, as it is contemplated that the number of mounting locations 102 may be more or less than four. Each chip mounting location 102 has a plurality of signal and power pads 108 for physically transferring power, data, control etc., between the carrier 100 and the IC chip 106 mounted therein. Integrated Circuit chips 106 are mounted on the carrier 100 in chip mounting locations 102 by a plurality of Controlled Collapsed Chip Connection C4's) solder balls 110. Conductive lands 112 on the top surface, and which may also be on the bottom surface, provide inter-chip wiring to wire together the mounted IC chips 106. Signals and power are provided to the carrier at a plurality of carrier pads 120 (see FIG. 2B), which also are connected to conductive lands 112. In the preferred embodiment of the present invention, the conductive lands 112 are Copper. However, any low resistance conductive material may be used in place of, or in combination with Copper for signal and power distribution.

Figure 2B:
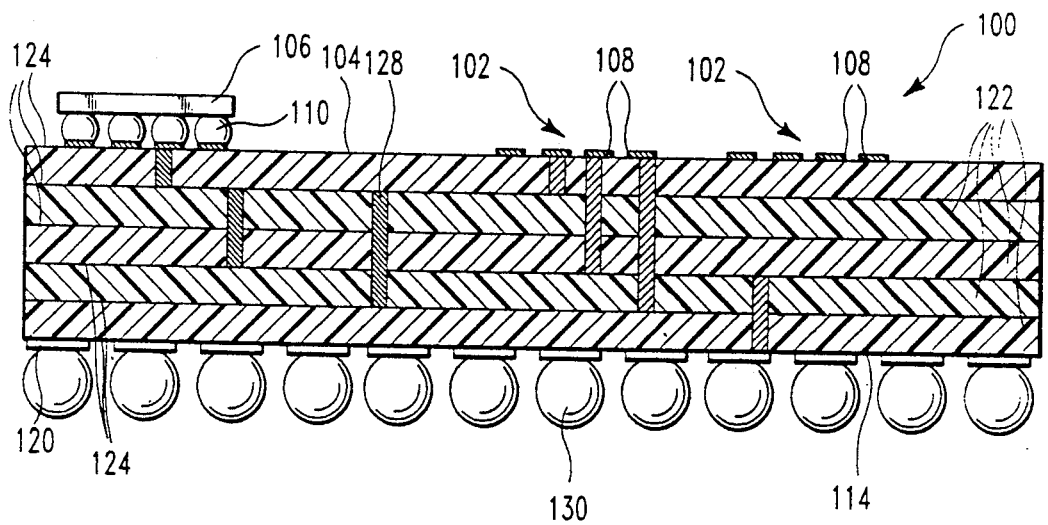
FIG. 2B is a cross-sectional view of the preferred embodiment of FIG. 2A, with a chip mounted in a chip location.

A cross-sectional view of carrier 100 at B—B is shown in FIG. 2B. The carrier 100 may have a single layer 122 of insulating material with a single conductive plane 124 on the top surface 104 or, if required, the carrier may have a second conductive plane 124 on its bottom surface 114. Alternatively, the carrier may be a multi-layer structure with conductive planes 124 separated by insulating layers 122 as shown in the cross-sectional view of FIG. 2B. If the carrier has more than one conductive plane 124, signals and power are distributed from the carrier's top surface 104 through the carrier 100 to other conductive planes, by interconnect vias or vias 128. The carrier 100 of this example has 5 insulating layers 122 and a conductive plane 124 sandwiched between each pair of insulating layers 122. Including the top surface 104, the bottom surface 114 and the 4 internal planes of the carrier, there are 6 conductive planes 124, each of which may include signal wiring or power distribution. The conductive planes 124 are functionally identical to the internal layers of a multilayer printed circuit card or a multi-layer ceramic substrate.

In one embodiment of the present invention, carrier solder balls 130 provide a means for directly mounting and connecting the carrier 100 onto a printed-circuit board (not shown). Alternatively, Polymer Metal Conductive (PMC) paste may be substituted for solder balls 130. The carrier solder balls 130 may be deposited on the carrier 100 or on the substrate, module package or printed circuit card. Additionally, although not shown, it is contemplated that the chip signal and power pads may have deposited solder on them or chip C4's 110 may provide solder for mounting chips 106.

In the preferred embodiments of the present invention, the material making up the insulating layers 122 is a resin composite material of resin epoxy and fiberglass, namely Fire Retardant-4 (FR-4). FR-4 is the same material used in the printed circuit card manufacture. It will be appreciated by a person of ordinary skill in the art, that any material having sufficient insulating characteristics may be substituted for FR-4.

Figure 3A:
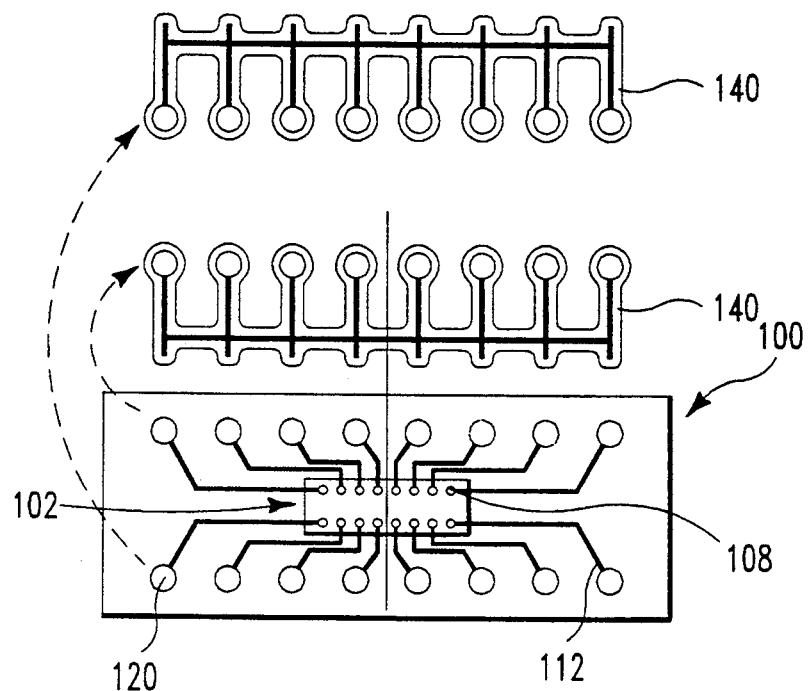
FIG. 3A & 3B are an assembly view and a plan view of a second embodiment of the present invention.

A second embodiment of the present invention is represented by the example of FIGS. 3A, showing an an assembly view, and 3B, showing a plan view. Since many of the features of the embodiments herein described are common to the embodiment of the example of FIGS. 2A and 2B, in order to minimize confusion, the numbering of common features is carried throughout the specification. Also, since the common features are sufficiently described in relation to FIGS. 2A and 2B, the description of common features will not be repeated.

Figure 3B:
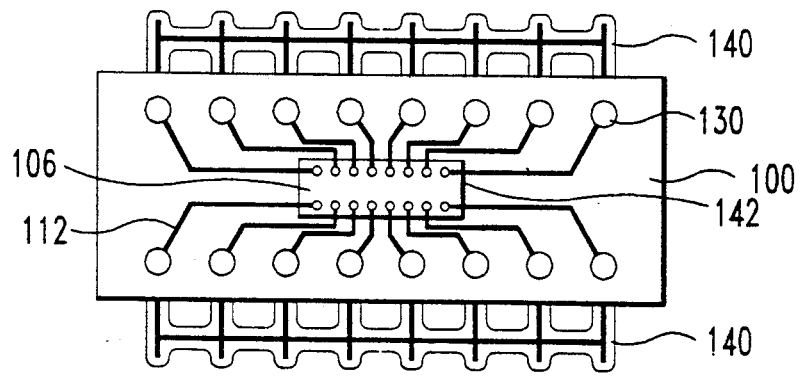

In the embodiment of FIGS. 3A and 3B, an IC chip 106 is mounted on carrier 100 as in the preferred embodiment of FIG. 2A and 2B. A lead-frame 140 such as typically used for a Plastic Leaded Chip Container (PLCC) package, is soldered to the carrier 100 by deposited solder balls 130 on the carrier pads 120. FIG. 3B is a plan view of the carrier 100 attached to the lead frame 140. Alternatively, the lead-frame 140 may be J lead type and solder may be deposited on the J lead lead-frame prior to mounting the carrier. Direct Chip Attach (DCA) organic polymerized encapsulent 142 deposited on the carrier 100 passivates and protects the C4's 110 and the mounted chip 106. Such a DCA organic polymerized encapsulant is disclosed in U.S. Pat. No. 4,604,644 to Beckham et al., assigned to the assignee of the present invention and incorporated herein by reference. Carriers 100 thus mounted on lead-frame 140 have improved heat transfer and dissipation, because the chips mounted on the carrier are not enclosed in a package.

Figure 4A:
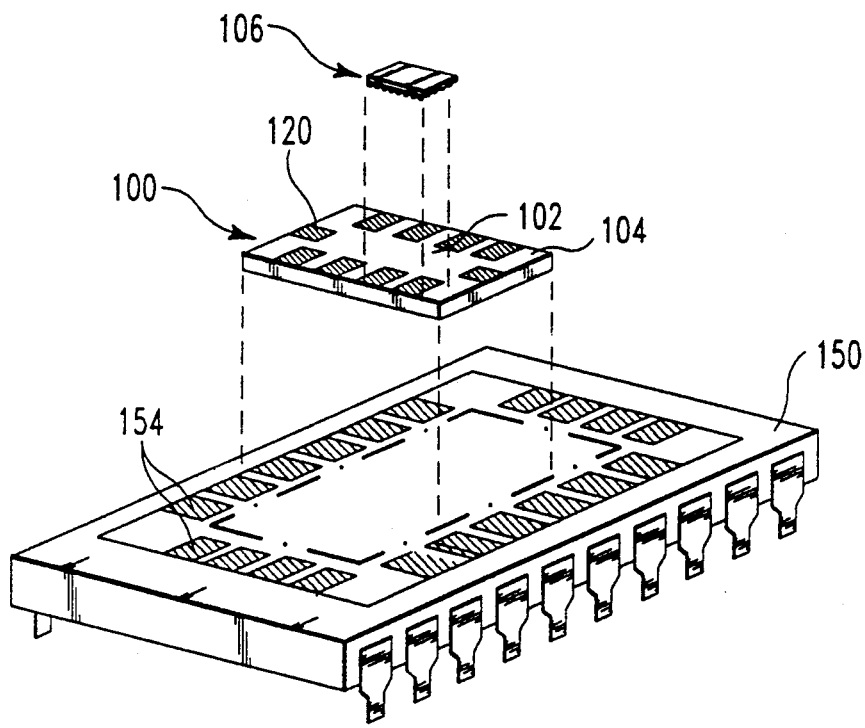
FIG. 4A & 4B provide an assembly view and a cross-sectional view of the assembly of a preferred embodiment of the present invention.
Figure 4B:
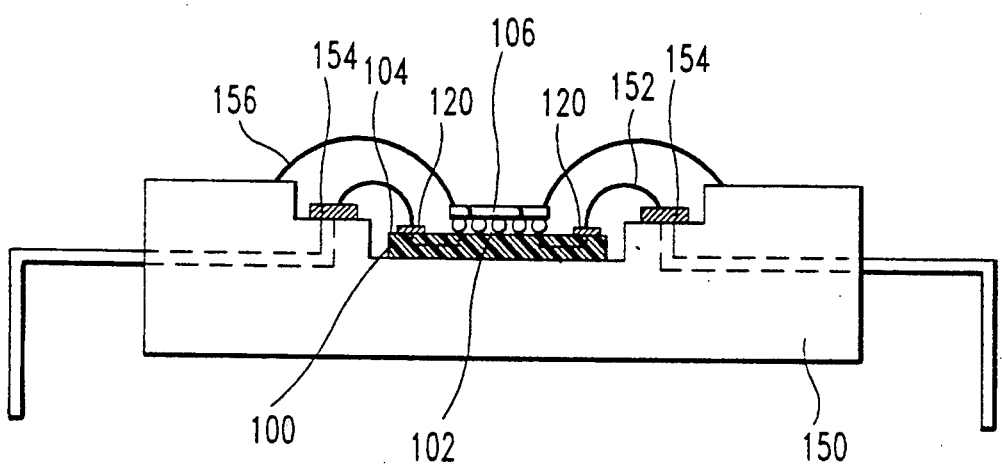

A third embodiment of the present invention is represented by the assembly view example of FIG. 4A, with FIG. 4B showing a cross-section of the assembly of FIG. 4A. A chip 106 is mounted in a chip mounting location 102 on the carrier 100. In this embodiment, the carrier pads 108 are on the top surface 104 and are suitable for wire bond connections. The carrier is not soldered to the package 150 as in the previous embodiments. Instead, the carrier is glued into a suitable package 150, such as a PLCC, with any suitable thermal-adhesive glue. Power and signals are transferred to and from the carrier through wire-bonds 152 between carrier connect pads 120 and wire bond pads 154 on the package 150. DCA organic polymerized Encapsulant 156 passivates and protects the chip 106, the carrier 100 and wire bond pads 154, as well as the wire bonds 152 themselves, which would otherwise be exposed. Alternatively, instead of DCA organic polymerized encapsulant 156, a standard package top (not shown) may be substituted. Thus, this embodiment of the present invention provides an inexpensive package for very small chips, which might otherwise require more expensive packaging techniques.

From the disclosed embodiments, it can be seen that the present invention provides an inexpensive, flexible packaging alternative for integrated circuit chips. The carrier also provides an inexpensive means of redirecting chip signals, such that two chips with identical function, but incompatible footprints may become interchangeable. This and other variations of the preferred embodiment of the present invention will occur to a person of ordinary skill in the art without departing from the scope and spirit of this invention.

We claim:

1. An integrated circuit module comprising:
   a carrier, said carrier comprising:
      chip mounting means for fixedly mounting at least one integrated circuit chip to said carrier, and
      distribution means for distributing said power and said signals to said at least one integrated circuit chip, said distribution means comprised of a plurality of carrier pads connected to a plurality of chip bonding pads by carrier wiring on at least one conductive plane, said conductive plane being on at least one layer of resin fiberglass composite material;
   said carrier being selected from at least two carriers with different distribution means, whereby two chips with identical function, but incompatible footprints, become interchangeable in an integrated circuit chip;
   the integrated circuit chip package; and,
   bonding means for mounting and connecting the carrier to said package.

2. The integrated circuit chip module of claim 1 wherein said at least one conductive plane comprises a plurality of conductive planes, and, each adjacent pair of said conductive planes being separated by one said at least one layer.

3. The distribution means of the carrier of claim 2 wherein at least two of said plurality of conductive planes are internal conductive planes and said at least one layer is a plurality of insulating layers, whereby each said insulating layer is sandwiched between a pair of said conductive planes.

4. The integrated circuit chip module of claim 3 wherein the chip mounting means comprises a deposited solder ball on each said chip bonding pad, whereby said deposited solder balls fixedly attach and electrically connect said each chip to said carrier.

5. The integrated circuit chip module of claim 3 wherein each said integrated circuit chip has a plurality of chip pads, and the chip mounting means comprises:
   glue;
   a plurality of wire bonds between the chip bonding pads and the chip pads; and,
   an organic encapsulant, whereby said chips are glued to said carrier and wire bonds are encased in said organic encapsulant.

6. The integrated circuit chip module of claim 3 wherein said integrated circuit chip package is a leaded chip carrier with a cavity and a plurality of package wire bond pads, and said chip mounting means comprises:
   a plurality of carrier wire bond pads; and
   a wire bond between each of said carrier wire bond pads and one of said package wire bond pads, whereby said carrier is fixedly mounted in said cavity.

7. The integrated circuit package of claim 3 wherein the bonding means are Polymer Metal Conductive Paste.

8. The integrated circuit chip package of claim 7 wherein the chip mounting means are Polymer Metal Conductive Paste.

9. An integrated circuit package comprising:
   a carrier, said carrier comprising:
      a plurality of wiring planes,
      a plurality of insulating layers of resin fiberglass composite material, each said insulating layer being sandwiched between an adjacent pair of said wiring planes,
      a plurality of vias, each of said vias extending from one of said wiring planes through at least one of said insulating layers to a second of said wiring planes,
      a plurality of carrier pads, and
      at least one chip mounting location on a surface of said carrier, said mounting location having a plurality of chip power and signal pads;
   said carrier being selected from at least two different carriers, the mounting location of one said carrier having a different chip power and signal assignment than the other said carrier, whereby two chips with identical functions, but incompatible footprints, become interchangeable in said package; and
   means for providing signal and power to said carrier.

10. The integrated circuit chip package of claim 9 wherein said means for providing signals and power is a lead frame fixedly mounted to said carrier at said carrier pads.

11. The integrated circuit package of claim 9 wherein said means for providing signal and power comprise:
   a leaded chip carrier with a cavity, a plurality of wire bond pads, and a plurality of package leads, said carrier being fixedly mounted in said cavity; and,
   a plurality of wire bonds connected between said plurality of carrier pads and said plurality wire bond pads.

12. The integrated circuit package of claim 9 wherein every integrated circuit chip mounted in said at least once chip mounting location is coated and protected by a deposited encapsulant.

13. The integrated circuit chip package of claim 11, wherein said carrier pads, said wire bond pads and said plurality of wire bonds are coated and passivated by a deposited encapsulant.

14. The integrated circuit chip package of claim 9 wherein said means for providing signals and power are Polymer Metal Conductive Paste.

15. The integrated circuit chip package of claim 14 wherein each said mounting location's chip power and signal pads have Polymer Metal Conductive Paste deposited thereon.

* * * * *